(12) United States Patent
Rutkowski et al.

(10) Patent No.: US 7,859,314 B2
(45) Date of Patent: Dec. 28, 2010

(54) METHOD AND SYSTEM FOR A SIGNAL DRIVER USING CAPACITIVE FEEDBACK

(75) Inventors: Joseph Rutkowski, Chandler, AZ (US); Alma Anderson, Chandler, AZ (US)

(73) Assignee: NXP B.V., Eindhoven (NL)

( * ) Notice: Subject to any disclaimer, the term of this patent is extended or adjusted under 35 U.S.C. 154(b) by 275 days.

(21) Appl. No.: 12/294,982

(22) PCT Filed: Mar. 31, 2007

(86) PCT No.: PCT/IB2007/051162
§ 371 (c)(1),
(2), (4) Date: Sep. 29, 2008

(87) PCT Pub. No.: WO2007/113765
PCT Pub. Date: Oct. 11, 2007

(65) Prior Publication Data
US 2010/0237919 A1    Sep. 23, 2010

Related U.S. Application Data

(60) Provisional application No. 60/787,858, filed on Mar. 31, 2006, provisional application No. 60/830,325, filed on Jul. 11, 2006.

(51) Int. Cl.
*H03B 1/00* (2006.01)
(52) U.S. Cl. .................... 327/108; 326/83
(58) Field of Classification Search .................... None
See application file for complete search history.

(56) References Cited

U.S. PATENT DOCUMENTS

| | | | |
|---|---|---|---|
| 4,689,740 A | | 8/1987 | Moelands et al. |
| 4,857,863 A | * | 8/1989 | Ganger et al. .............. 330/264 |
| 5,051,625 A | * | 9/1991 | Ikeda et al. ................. 326/27 |
| 5,587,678 A | * | 12/1996 | Dijkmans ................... 327/108 |
| 5,872,473 A | * | 2/1999 | Williams ................... 327/108 |
| 5,949,259 A | | 9/1999 | Garcia |
| 5,973,512 A | * | 10/1999 | Baker ......................... 326/87 |
| 6,236,239 B1 | * | 5/2001 | Kogushi ...................... 326/88 |

(Continued)

FOREIGN PATENT DOCUMENTS

EP    0368524 A1    5/1990

(Continued)

OTHER PUBLICATIONS

"Zero Delay Logic Addresses PC Design Challenges," Captured at 16:00 Hrs Bangalore time; SC-1 (URL: http://www.fairchildsemi.com/collateral/aseeswitch.pdf), Nov. 1998.

*Primary Examiner*—Cassandra Cox

(57) ABSTRACT

Edge-rate control circuits and methods are implemented using a variety of arrangements and methods. Using one such method, an output signal of a bus is controlled by decoupling a feedback capacitor (116) from a gate of a transistor (108) using an isolation switch (106). The transistor (108) is used to control the output signal. A predetermined amount of charge is removed from the feedback capacitor (116) using a charge distribution capacitor (114) that is selectively coupled to the feedback capacitor (116) using a switch (112). The switch (112) is enabled in response to the output signal reaching an output voltage and disabled in response to the charge distribution capacitor (114) reaching a reference voltage.

17 Claims, 2 Drawing Sheets

U.S. PATENT DOCUMENTS

Figure 1:
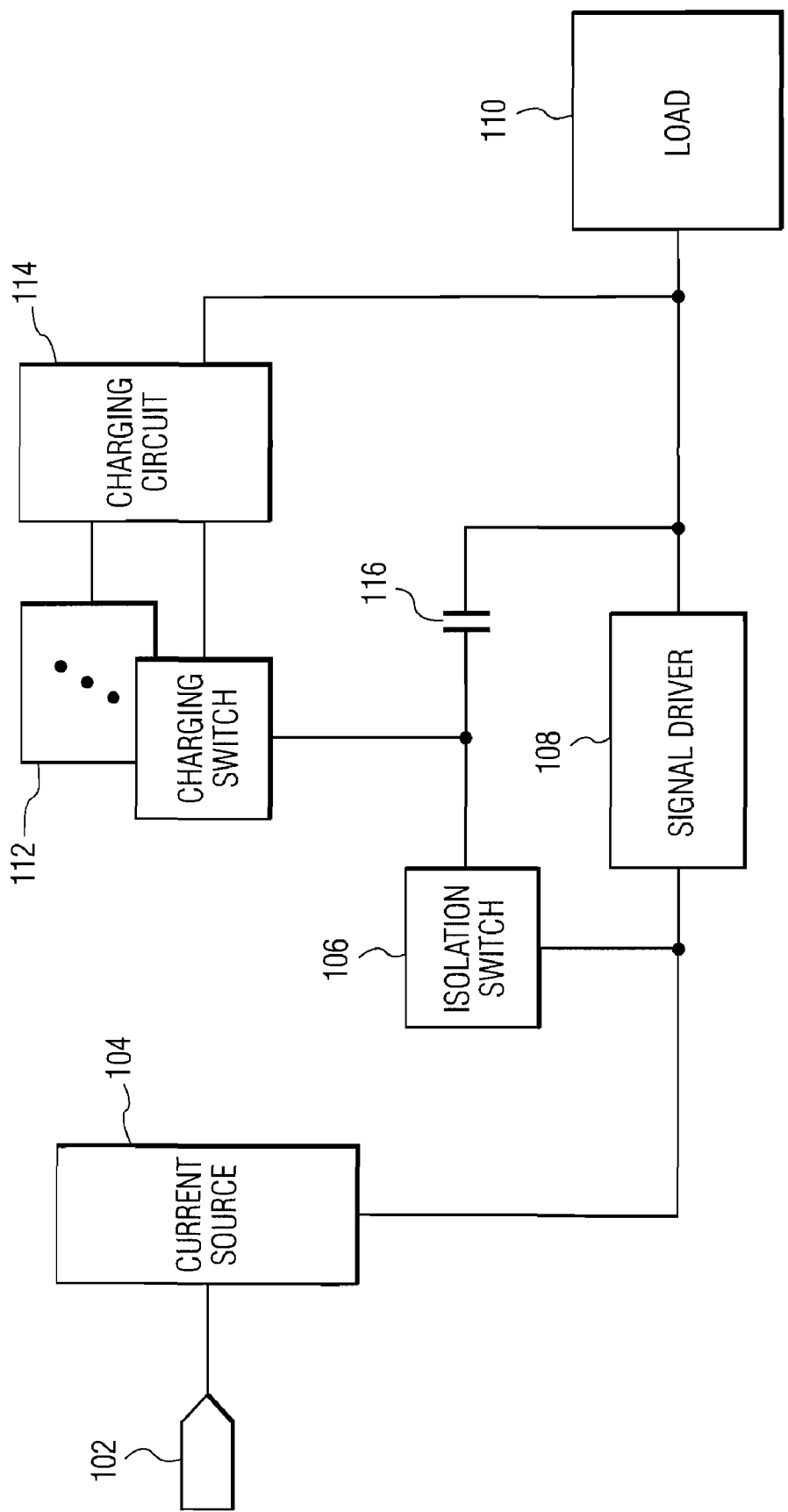

| | | |
|---|---|---|
| 6,320,432 B1 | 11/2001 | Nagao |
| 6,876,235 B2 * | 4/2005 | Li et al. .................. 327/112 |
| 7,286,172 B2 * | 10/2007 | Mizuno et al. ............ 348/294 |
| 7,295,047 B2 * | 11/2007 | Lee et al. ................. 327/108 |
| 7,420,395 B2 * | 9/2008 | Kuramasu ................. 326/83 |
| 7,482,845 B2 * | 1/2009 | Lee et al. ................. 327/112 |

FOREIGN PATENT DOCUMENTS

| | | |
|---|---|---|
| EP | 1526623 A1 | 4/2005 |
| WO | 0074239 A | 12/2000 |

* cited by examiner

METHOD AND SYSTEM FOR A SIGNAL DRIVER USING CAPACITIVE FEEDBACK

This application claims priority from earlier filed provisional application No. 60/787,858 titled, "Enhanced Pre-Charging Control Circuit for Open Drain Output Devices," filed on Mar. 31, 2006.

The present invention relates generally to an output signal driver and, more particularly, to the implementation of a signal driver with capacitive feedback.

Electrical systems often use interconnections to transmit information between components of the system. Such interconnections generally consist of one or more signal lines that taken together are also know as bus. To transmit the information the components of the system must drive the voltage level of the bus line to the appropriate level. Often there are specifications that determine how fast or slow the voltage can change in a particular system. For example, some systems use a bus protocol known as the Inter-Integrated Circuit bus, or I²C bus.

The I²C bus is a control bus that provides the communications link between integrated circuits in a system. Developed by Philips in the early 1980s, this simple two-wire bus with a software-defined protocol has evolved to become the de facto worldwide standard for system control, finding its way into everything from temperature sensors and voltage level translators to EEPROMs, general-purpose I/O, A/D and D/A converters, CODECs, and microprocessors of all kinds. U.S. Pat. No. 4,689,740 of Moelands et al. titled, "Two-Wire Bus-System Comprising a Clock Wire and a Data Wire for Interconnecting a Number of Stations" describes a computer system that comprises a number of station which are interconnected by a clock bus wire and a data bus wire to form a wired logic bus from the signals generated thereon by the stations, and is incorporated by reference in its entirety.

The I²C-bus also saves space and lowers overall cost. Using I²C specification, designers can move quickly from a block diagram to final hardware, simplifying the addition of new devices and functions to an existing bus interface. As the system evolves over several generations, I²C devices can easily be added or removed without impacting the rest of the system. The two-line structure means fewer trace lines, so the PCB can be much smaller. Debug and test are easier, too, since there are fewer trace lines and a relatively simple protocol.

There are several reasons why the I²C-bus has endured for more than 20 years. To begin, recently introduced hubs, bus repeaters, bidirectional switches and multiplexers have increased the number of devices the bus can support, extending the number of devices originally limited by a maximum bus capacitance of 400 pF. Also, software-controlled collision detection and arbitration prevent data corruption and ensure reliable performance, even in complex systems. Beyond performance, though, there is ease of use. Two simple lines connect all the ICs in a system. Any I²C device can be attached to a common I²C-bus, and any master device can exchange information with any slave device. The software-controlled addressing scheme eliminates the need for address-decoding hardware, and there's no need to design and debug external control logic because it's already provided by the I²C protocol. Additionally, the bus has kept pace with performance and today provides four levels of data rate transfer implemented using increasing clock speeds. For example, the clocks speeds can be up to 100 KHz in Standard mode, up to 400 KHz in Fast mode, up to 1 Mhz in Fast mode plus and up to 3.4 MHz in High-Speed mode.

Per the Fast Mode Plus specification, the on-chip I²C interface includes an open drain NMOS pull-down device, while a single pull-up resistor is common to all devices on the I²C bus. To compensate for the increased bus speed of Fast Mode Plus, the specification requires maximum edge-rate transition timings for the bus signals. The maximum rising slew transition timing can be met be selecting a suitably strong (small resistance) pull-up resistor. The Fast Mode Plus specification requires the maximum falling-edge transition (70%-30%) to not exceed 120 ns. In addition, to avoid susceptibility to Electromagnetic interference (EMI) and signal reflections, the minimum falling edge transition (70%-30%) cannot occur in less than 20 ns. Thus, the NMOS pull-down device must be capable of controlling the edge rate to provide a falling-edge transition within the maximum and minimum requirements. This requirement is further complicated because the pull-up resistor values and bus capacitance values vary from one I²C mode to another and also from one I²C bus application to another.

One method used to control minimum falling-edge rate of an NMOS pull-down device is to use capacitive feedback between the output signal and the gate. While this method can be useful for controlling the edge-rate of the falling-edge transition, it has its disadvantages. For example, the capacitive feedback can slow down how fast the device is enabled by increasing the charge time necessary to reach the threshold voltage of the NMOS pull-down device. Moreover, during a rising-edge transition the capacitive feedback can cause the NMOS pull-down device to enable, pulling down the signal and causing glitches in the signal. This unwanted enabling of the pull-down device is increasingly problematic as the bus speeds increase (e.g., for Fast Mode Plus).

These and other issues present problems in controlling the edge rate of signal-driver circuits. Accordingly, there is room for improvement in controlling the edge rate of a pull-down device.

Various aspects of the present invention are directed to methods and arrangements for edge-rate control in a manner that addresses and overcomes the above-mentioned issues.

Consistent with one example embodiment, a circuit arrangement is implemented for controlling an output signal of a bus. The circuit arrangement includes a transistor for controlling the output signal. A feedback capacitor is coupled to the output signal and selectively coupled to the gate of the transistor using an isolation switch. A first charge distribution capacitor is selectively coupled to the feedback capacitor using a switch. The switch is enabled in response to the output signal reaching an output voltage and disabled in response to the first charge distribution capacitor reaching a reference voltage.

Consistent with another example embodiment, a method for controlling an output signal of a bus is implemented. A feedback capacitor is decoupled from a transistor gate using an isolation switch. The transistor is used to control the output signal. A predetermined amount of charge is removed from the feedback capacitor using a charge distribution capacitor. The charge distribution capacitor is selectively coupled to the feedback capacitor using a switch that is enabled in response to the output signal reaching an output voltage and disabled in response to the first charge distribution capacitor reaching a reference voltage.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

Figure 2:
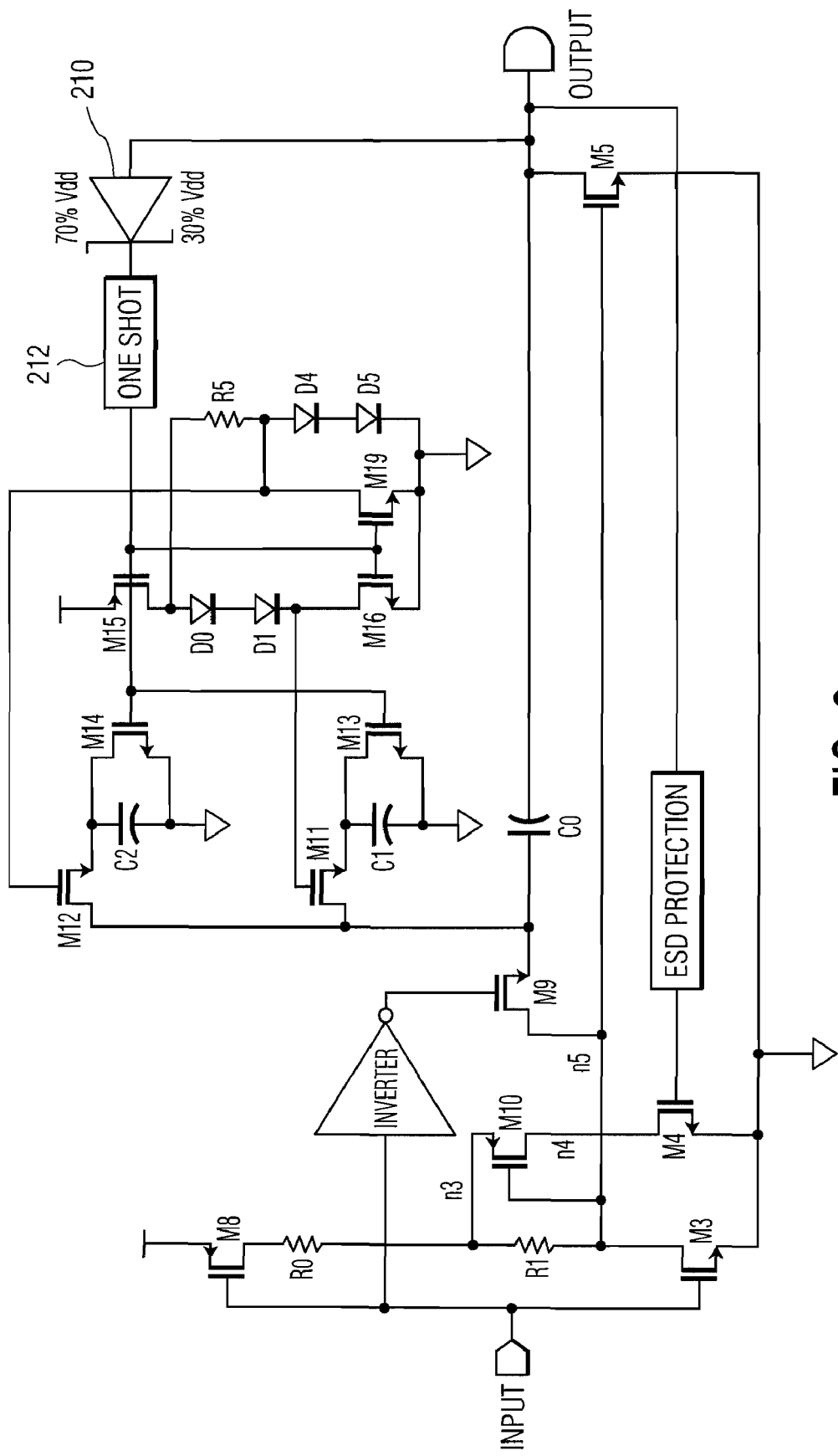

The invention may be more completely understood in consideration of the following detailed description of various embodiments of the invention in connection with the accompanying drawings, in which:

FIG. 1 shows a block diagram of an edge-rate control circuit, according to an example embodiment of the present invention; and FIG. 2 shows a schematic diagram of an edge-rate control circuit, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

The present invention is believed to be applicable to a variety of edge rate control devices and approaches. While the present invention is not necessarily limited to such applications, an appreciation of various aspects of the invention is best gained through a discussion of examples in such an environment.

Consistent with an example embodiment of the present invention, a circuit arrangement is implemented for controlling an output signal of an I$^2$C bus. The circuit arrangement includes a transistor for controlling the output signal by, for example, acting as a pull-down. A feedback capacitor is coupled to the output signal on one end and to a switch on the other. The switch is connected to the gate of the transistor. The feedback capacitor is also connected to a pair of charge distribution capacitors through a pair of switches. The switches are, in part, each enabled with respect to the voltage of the respective capacitor and a respective reference voltage.

Consistent with another example embodiment of the present invention, a pull-down NMOS device is used as an open collector pull-down in a circuit configured for use in an I$^2$C bus system. When the NMOS device operates as an I$^2$C bus signal pull-down, a capacitive feedback component is connected between an I$^2$C bus signal and the gate of the NMOS device. When the device is not operating to pull the I$^2$C bus signal down, the capacitive feedback component is disconnected from the gate of the NMOS device. This can be particularly useful for avoiding unwanted gate voltage as a result of a change in voltage (dv/dt) on the I$^2$C bus signal.

In one instance, the capacitive feedback component can be set to a precharge voltage after it is disconnected from the gate of the NMOS device. Thus, when the capacitive feedback component is subsequently connected to the gate of the NMOS device, the precharge voltage reduces the enablement time of the NMOS device. In a particular example, one or more discharge capacitors distribute the charge stored on the capacitive feedback component, thereby setting the precharge voltage. This can be particularly useful for reducing charge on the capacitive feedback component to the precharge voltage, prior to enabling the NMOS device.

FIG. 1 shows a block diagram of an edge-rate control circuit, according to an example embodiment of the present invention. The diagram depicts several elements including input 102, current source 104, isolation switch 106, signal driver 108, load 110, charging switches 112, charging circuit 114 and feedback capacitive component 116. In response to the input 102, the circuit drives a signal connected to the load 110. For example, the load 110 can be driven by enabling or disabling a pull-down device in signal driver 108. Signal driver 108 produces an edge rate of the output signal edge rate that is proportional to the input signal and the load 110. Current source 104 and feedback component 116 affect the input signal, and thus, affect the edge rate of the output signal.

In the case of an I$^2$C bus signal, signal driver 108 is a pull-down device and load 110 includes a pull-up resistor and one or more devices on the bus. The pull-up resistor value is variable from application to application and is often a stronger pull-up for the faster bus modes. The number of other devices and their respective load on the bus is also variable from application to application.

Isolation switch 106 is used to connect or disconnect (isolate) feedback component 116 from signal driver 108. When connected, feedback component 116 limits the edge rate of the output signal by coupling the output signal to the input of signal driver 108. Thus, the circuit limits the edge rate of the output signal (dv/dt) as a function of the input signal and the capacitance of feedback component 116. Once the output signal has completed a signal transition, the need for limiting the edge rate using feedback component 116 no longer exists. Accordingly, isolation switch 106 disconnects the feedback component from signal driver 108.

Prior to the next transition initiated by signal driver 108, a portion of the voltage stored on feedback component 116 is transferred to charging circuit 114 through charging switch elements 112. The switching elements 112 can be activated in response to the output signal reaching a voltage level resulting from signal driver 108 becoming inactive. For instance, if the signal driver 108 is a pull-down to near zero volts, the switching elements 112 can be configured to activate when the output signal reaches 75% of the high signal voltage.

In one embodiment of the present invention, charging circuit 114 includes one or more capacitors having corresponding charging switch elements 112. The switching elements 112 are arranged to allow charge to flow between the feedback component 116 and the capacitors of the charging circuit 114. The amount of charge stored by feedback component 106 is equal to the capacitance of feedback component 116 multiplied by the difference between final voltage applied to signal driver 108 and the final output signal voltage. The final voltage applied to signal driver 108 is generally dependent upon the supply voltage of the edge control circuit and the final output voltage generally near zero. A portion of the charge on feedback component 116 is removed using charging circuit 114 and switch elements 112 to distribute the charge stored on feedback component 116. Thus, the amount of charge removed from feedback component 116 can be controlled independent of the output signal voltage. This is particularly useful for circuits that are designed to be compatible with a variety of signal voltages.

In one instance, the switching elements 112 are configured to control the flow of charge based upon the voltage of the corresponding capacitor. For example, a charging circuit can be designed with two capacitors and two switching elements. The first switching element can be configured to be active until the first capacitor reaches a voltage X, and the second switching element can be configured to be active until the second capacitor reaches a voltage Y. The voltages X and Y can be set based upon various criteria, such as the supply voltage and the turn-on characteristics of signal driver 108. The total amount of charge removed from feedback component 116 is equal to the sum of the charge stored on each capacitor, and each capacitor has a charge equal to the capacitance of capacitor multiplied by the voltage of the capacitor.

In another example embodiment of the present invention, the amount of charge distributed can also be affected by the initial voltage of each capacitor (i.e., prior to activating switching elements 112). Accordingly, the initial voltage of each capacitor can controlled, in conjunction with the final distribution voltage, to determine the amount of charge that is distributed.

After the charging switch elements 112 have transferred the charge, switch elements 112 isolate charging circuit 114 from feedback component 116. Charging circuit discharges the distributed charge from the charging circuit to allow for subsequent distributions. When the edge rate control circuit subsequently drives the signal connected to the load 110, the remaining charge of feedback component 116 is used as the initial charge (voltage) applied to signal driver 108. In this manner, the initial turn-on time of signal driver 108 can be reduced while still allowing for edge rate control.

In one embodiment of the present invention, the amount of charge removed from feedback component 116 is inversely proportional to the supply voltage of the circuit. This can be accomplished by having the charging circuit voltage at which one or more of the switching elements are disabled depend from the supply voltage of the circuit. In this instance, as the supply voltage is increased, the charging circuit is charged to a higher voltage resulting in an increase in the amount of charge removed from feedback component 116. The increase in the amount of charge removed helps compensate for the increased drive capabilities of the circuit due to higher supply voltages. This can be particularly useful for circuits designed to operate with different supply voltages.

In another embodiment of the present invention, switch elements 112 and charging circuit 114 are activated for a limited time period after the output voltage reaches a certain level. In response to the activation, certain power dissipating components, such as reference voltage generating circuits, are enabled. After the limited time period, the power dissipating components are disabled. The limited time period can be controlled using a number of delay or clock circuits. In one instance, a one-shot circuit can be configured to produce an activation pulse during which the power dissipating components are active. Other example timing circuits include charging a capacitor to a voltage through a resistive element and using a clock driven timing circuit.

FIG. 2 shows a schematic diagram of an edge rate control circuit, according to an example embodiment of the present invention. Device M5 is used to drive the output signal low in response to the input signal. Feedback capacitor $C_0$ is used to limit the edge rate of the output signal and also as to provide an initial turn-on voltage to device M5. In an open-drain bus system (e.g., I²C), the output is tied to a pull-up resistor that pulls the output high when no devices are driving the output.

For a high to low voltage transition on the data bus, the edge rate control circuit charges the gate node of the output device to roughly the supply voltage of the part using device M8 to charge the gate node through resistors R0 and R1. Once the input transitions from low to high, device M9 acts as the isolation switch to isolate the feedback capacitor from the gate of device M5, and thereby, allows the stored charge on the feedback capacitor to remain independent of the gate voltage of device M5. A threshold voltage drop across device M9 limits the stored charge to $Q_{feedback}=C_{feedback}*(V_{part\_supply\_voltage}-V_{threshold\_M9}-V_{OL\_M5})$, where $V_{OL\_M5}$ is the output signal voltage at the time the feedback capacitor is isolated.

In response to the input being high, device M5 is disabled by enabling device M3, which drives the gate of device M5 to ground, allowing the output signal to be pulled high. Comparator 210 is used to determine when the output has reached 75% of its final value. When this occurs, a pulse is created by one shot circuit 212. The pulse turns off the devices M14 and M13, enables device M15 and turns off devices M16 and M19. Two reference voltages are created during the time M15 is enabled and devices M16 and M19 are disabled. The first reference voltage is $V_{part\_supply\_voltage}-2*V_{threshold}$. The second reference voltage is $2*V_{threshold}$. Assuming that each of the two reference voltages exceeds the threshold voltage of the respective device M11 or M12 to which they are connected, charge begins to flow into the capacitors $C_1$ and $C_2$. The voltage across the capacitors is limited to reference voltage minus the threshold voltage of the pass gate. Once $C_2$ is fully charged the voltage across the capacitor will be roughly $V_{threshold}$, while the voltage across capacitor $C_1$ will be roughly $V_{part\_supply\_voltage}-3*V_{threshold}$. Therefore, by establishing the appropriate ratios between the capacitance of capacitors $C_0$, $C_1$, and $C_2$, it is possible to remove an amount of charge from the feedback capacitor that is derived from the supply voltage and the threshold voltage. In the embodiment shown in FIG. 2, the amount of voltage removed is increased as the supply voltage increases. This example is not intended to be limiting as various other relationships between the supply voltage and the amount of voltage removed are possible.

The circuit of FIG. 2 distributes the charge from C0 to capacitors $C_1$ and $C_2$ during the pulse of one shot circuit 212. After the pulse, the reference voltages are disabled, and any charge on the capacitors is removed through the activation of devices M14 and M13. Thus, to guarantee proper charge distribution, one shot circuit 212 produces a sufficiently long pulse to allow for the charge distribution to occur. The pulse length can also affect the power requirements of the circuit because the current draw of the circuit can be reduced by disabling the reference voltages. Thus, to reduce the power dissipated by the circuit the pulse length should be kept sufficiently short.

During the next high to low transition on the input, the isolation switch M9 is opened and charge on feedback capacitor $C_0$ is applied to node n5. The resulting voltage on node n5 is a function of $C_0$, $C_{gs\_M5}$ (where $C_{gs}\_M5$ equals the gate capacitance of device M5), $Q_{feedback}$, and the voltage at the output signal. This initial charge on feedback capacitor $C_0$ is transferred to the gate of device M5 and results in an initial gate voltage that does not depend on the edge rate controlling current provided by the circuit. Once the initial charge is transferred to the gate of device M5, the edge rate controlling current becomes the dominate factor in the control of device M5 and the output signal. Thus, the feedback capacitor charge can be selected so as to decrease the turn-on time for the device, while minimizing any adverse effect on the minimum falling edge rate. This decreased turn-on time can be particularly useful when a heavy load is present at the output.

In one embodiment of the present invention, the edge-rate control circuit can be implemented using more than two capacitors and two switch elements for charge distribution. These additional capacitors and switch components can have different reference voltages and capacitance values to provide different charge distributions. For example, the additional components could be used for an edge-rate circuit that operates in modes that result in different levels of charge ($Q_{feedback}$). To account for the different levels, the additional components could be selectively used depending upon the level of $Q_{feedback}$.

In another embodiment of the present invention, the charge distribution circuit can be implemented using a resistor network or other voltage controlling circuits to generate the reference voltages. This can be particularly useful for matching the distributed charge desired while using standard capacitor values.

The various embodiments described above and shown in the figures are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, applications other than I²C buses may be amenable to implementation using similar approaches. Such modifications and changes do not depart from the true scope of the present invention that is set forth in the following claims.

The invention claimed is:

1. For controlling an output signal of a bus, a circuit arrangement comprising:
   a transistor having a gate, the transistor for controlling the output signal;
   a feedback capacitor, the feedback capacitor coupled to the output signal and selectively coupled to the gate of the transistor using an isolation switch; and
   a first charge distribution capacitor selectively coupled to the feedback capacitor using a first switch, the first switch enabled in response to the output signal reaching an output voltage and the first switch disabled in response to the first charge distribution capacitor reaching a first reference voltage.

2. The circuit arrangement of claim 1 further including, a second charge distribution capacitor selectively coupled to the feedback capacitor using a second switch, the second switch enabled in response to the output signal reaching the output voltage and the second switch disabled in response to the second charge distribution capacitor reaching a second reference voltage.

3. The circuit arrangement of claim 1 wherein, the feedback capacitor coupled to the gate of the transistor when the circuit arrangement is effecting a falling-edge transition on the output signal.

4. The circuit arrangement of claim 3 wherein, the feedback capacitor is decoupled from the gate of the transistor when the circuit arrangement is effecting a rising-edge transition on the output signal.

5. The circuit arrangement of claim 2 wherein, the first reference voltage is a function of a supply voltage for the circuit arrangement.

6. The circuit arrangement of claim 5 wherein, the second reference voltage is a function of a threshold-voltage of a semiconductor device.

7. The circuit arrangement of claim 2 wherein, a stored voltage on the first charge distribution capacitor and a stored voltage on the second charge distribution capacitor are discharged after completion of a one-shot pulse.

8. The circuit arrangement of claim 1 wherein, the output signal is an inter-integrated circuit signal.

9. A method for controlling an output signal of a bus, the method comprising:
   decoupling a feedback capacitor from a gate of a transistor using an isolation switch, the transistor used to control the output signal; and
   removing a predetermined amount of charge from the feedback capacitor using a first charge distribution capacitor that is selectively coupled to the feedback capacitor using a first switch, the first switch enabled in response to the output signal reaching an output voltage and the first switch disabled in response to the first charge distribution capacitor reaching a first reference voltage.

10. The method of claim 9 wherein the step of removing a predetermined amount of charge further includes using a second charge distribution capacitor selectively coupled to the feedback capacitor using a second switch, the second switch enabled in response to the output signal reaching the output voltage and the second switch disabled in response to the second charge distribution capacitor reaching a second reference voltage.

11. The method of claim 9 further including the step of coupling the feedback capacitor to the gate of the transistor when the circuit arrangement is effecting a falling-edge transition on the output signal.

12. The method of claim 11 further including the step of decoupling the feedback capacitor from the gate of the transistor when the circuit arrangement is effecting a rising-edge transition on the output signal.

13. The method of claim 10 wherein, the first reference voltage is a function of a supply voltage for the circuit arrangement.

14. The method of claim 13 wherein, the second reference voltage is generated using a threshold-voltage of one or more semiconductor devices.

15. The method of claim 10 further including the step of, discharging a stored voltage on the first charge distribution capacitor and a stored voltage on the second charge distribution capacitor in response to the absence of an activation signal, the activation signal enabling the charging the first and second charge distribution capacitors.

16. The method of claim 9 wherein, the output signal is an inter-integrated circuit signal.

17. For controlling an output signal of a bus, a circuit arrangement comprising:
   a signal driver means for controlling the output signal;
   a feedback means for providing feedback from the output signal, the feedback means having a feedback capacitor, the feedback capacitor coupled the output signal and selectively coupled to a gate of the signal driver means using an isolation switch; and
   a first charge distribution means for distributing charge from the feedback capacitor, the first charge distribution means selectively coupled to the feedback capacitor using a first switch the first switch enabled in response to the output signal reaching an output voltage and the first switch disabled in response to the first charge distribution capacitor reaching a first reference voltage.

* * * * *